(12) United States Patent
Saint-Laurent et al.

(10) Patent No.: US 6,573,777 B2
(45) Date of Patent: Jun. 3, 2003

(54) VARIABLE-DELAY ELEMENT WITH AN INVERTER AND A DIGITALLY ADJUSTABLE RESISTOR

(75) Inventors: Martin Saint-Laurent, Austin, TX (US); Haytham Samarchi, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/893,870

(22) Filed: Jun. 29, 2001

(65) Prior Publication Data

US 2003/0001649 A1 Jan. 2, 2003

(51) Int. Cl.[7] .............................................. H03H 11/26
(52) U.S. Cl. ...................................... 327/276; 327/270
(58) Field of Search ................................. 327/270, 276, 327/272, 278, 281, 284, 288, 149, 158, 161, 261, 263, 264

(56) References Cited

U.S. PATENT DOCUMENTS

| | | | | |
|---|---|---|---|---|
| 5,790,612 A | * | 8/1998 | Chengson et al. | 327/148 |
| 5,828,258 A | * | 10/1998 | Ooishi et al. | 327/276 |
| 6,025,747 A | * | 2/2000 | Okayasu et al. | 326/104 |
| 6,297,680 B1 | * | 10/2001 | Kondo | 327/276 |

* cited by examiner

Primary Examiner—Timothy P. Callahan
Assistant Examiner—Linh Nguyen
(74) Attorney, Agent, or Firm—Kenyon & Kenyon

(57) ABSTRACT

A clock distribution network is provided which includes variable-delay element. The variable-delay element consists of an inverter and a digitally adjustable resistor. The digitally adjustable resistor includes a plurality of transistors provided in plurality of rows and a plurality of columns. The variable-delay element functions logically equivalent to the inverter in which the delay is varied in accordance with the variance in resistance of the digitally adjustable resistor.

10 Claims, 10 Drawing Sheets

VARIABLE-DELAY ELEMENT WITH AN INVERTER AND A DIGITALLY ADJUSTABLE RESISTOR

FIELD OF THE INVENTION

The present invention relates to a delay circuit in a data processing system, and more particularly, to a digitally adjustable resistor applied to the construction of a variable-delay element.

BACKGROUND

Data processing systems, such as microprocessors, may include a circuit designed to distribute a reference signal called a clock to synchronize the processing of data. The clock may be distributed to multiple elements acting as receivers in the data processing systems. The closer the sequential elements are to receiving the clock at the same time, the faster the data processing systems can be. Delay elements may compensate the undesired delay variations experienced by the clock when the clock travels toward the receivers, thereby increasing the system speed.

BRIEF DESCRIPTION OF THE DRAWINGS

The present invention is illustrated by way of example and not limitation in the figures of the accompanying drawings in which like references indicate similar elements and in which.

DETAILED DESCRIPTION

Figure 1:
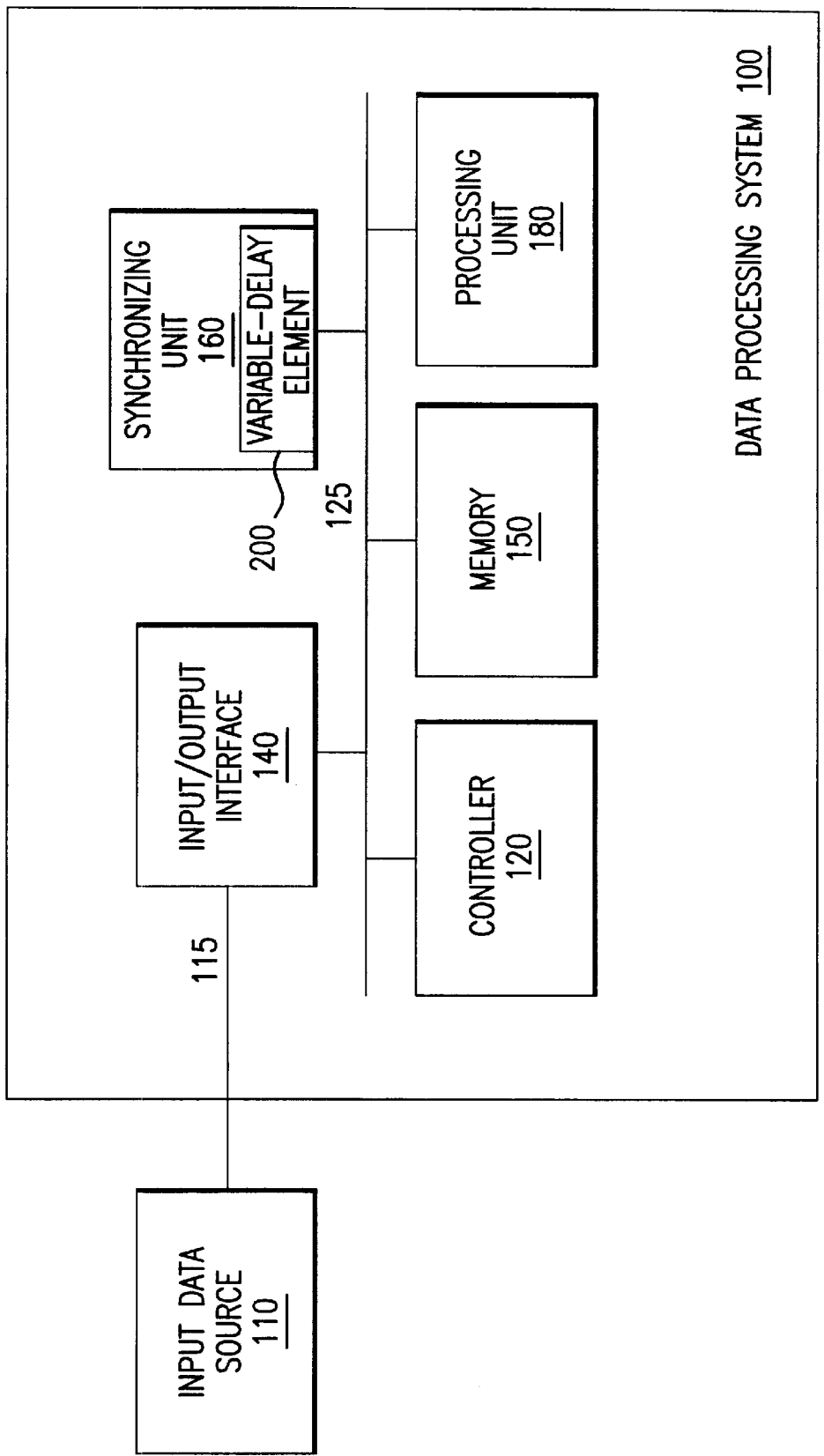
FIG. 1 shows one exemplary embodiment of a portion of a data processing system in which the present invention may be used.

FIG. 1 shows one exemplary embodiment of a data processing system used in accordance with one exemplary embodiment of the present invention. As shown in FIG. 1, an input data source 110 is connected to the data processing system 100 over link 115. The input data source 110 can be a digital camera, a scanner, or a locally or remotely located computer, or any other known or later developed device that is capable of generating electronic data. The input data source 110 can be integrated with the data processing system 100, or the input data source 110 can be connected to the data processing system 100 over a connection device, such as a modem, a local area network, a wide area network, an intranet, the Internet, any other distributed processing network, or any other known or later developed connection device.

It should also be appreciated that, the input data source 110 is thus any known or later developed device that is capable of supplying electronic data over the link 115 to the data processing system 100. The link 115 can thus be any known or later developed system or device for transmitting the electronic image data from the image data source 100 to the data processing system 100.

As shown in FIG. 1, in one exemplary embodiment, the data processing system 100 includes a controller 120, an input/output interface 140, a memory 150, a synchronizing unit 160, and a processing unit 180, each of which is interconnected by a control and/or data bus 125. The link 115 from the input data source 110 is connected to the input/output interface 140. The electronic input data from the input data source 110 is input through the input/output interface 140, and, under control of the controller 120, is stored in the memory 150 and/or provided to the controller 120 to be processed by the processing unit 180. The synchronizing unit 160 controls the synchronization of the data flow between the controller 120, the input/output interface 140, the memory 150, and the processing unit 180.

The memory 150 preferably has at least an alterable portion and may include a fixed portion. The alterable portion of the memory 150 can be implemented using static or dynamic RAM, a floppy disk and disk drive, a hard disk and disk drive, flash memory, or any other known or later developed alterable volatile or non-volatile memory device. If the memory 150 includes a fixed portion, the fixed portion can be implemented using a ROM, a PROM, an EPROM, and EEPROM, a CD-ROM and disk drive, a writable optical disk and disk drive, or any other known or later developed fixed memory device.

As shown in FIG. 1, the synchronizing unit 160 includes a variable-delay element 200. The variable-delay element 200 is provided to compensate delay variations experienced during data processing, thereby increasing the speed of the data processing system 100. In accordance with one exemplary embodiment, skew may be deliberately introduced between clock domains of the elements in the data processing system 100. Determination of how much skew a data path can tolerate may be used to characterize the timing margin for the path.

Variable-Delay Element Circuit Topology

Figure 2:
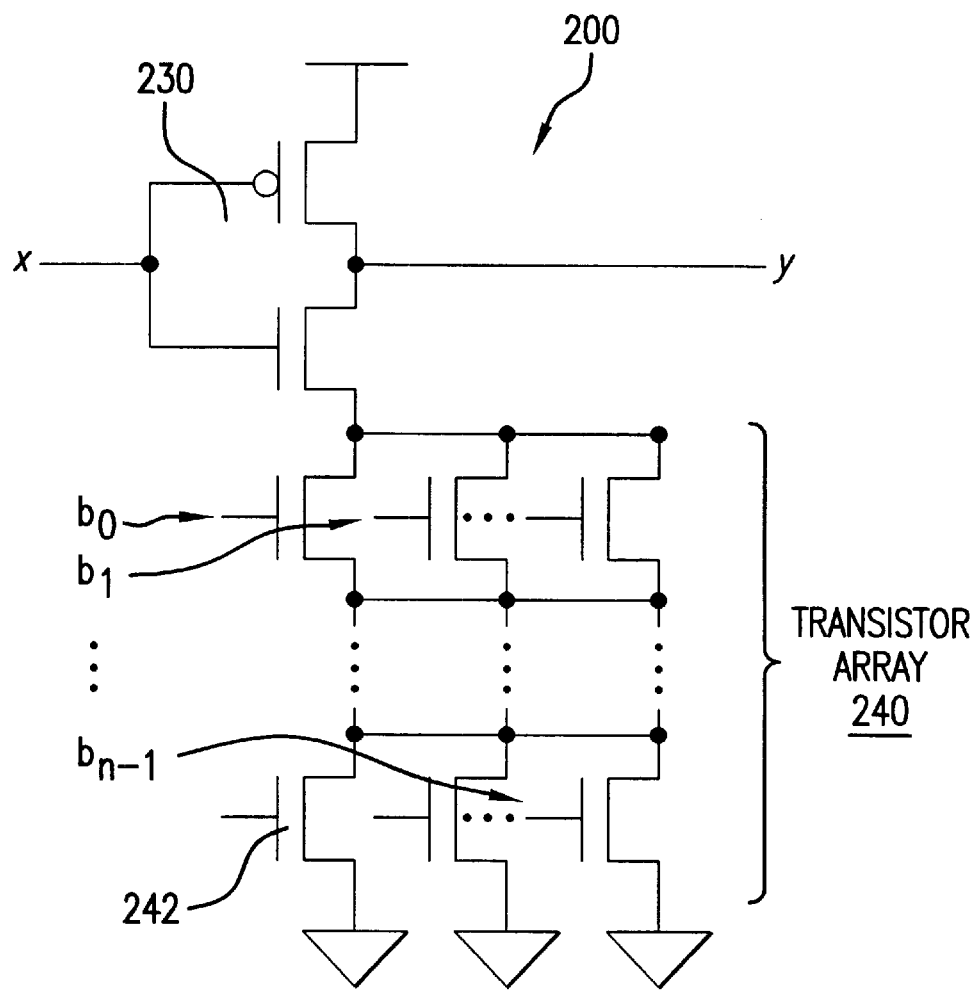
FIG. 2 shows an exemplary embodiment of the general circuit topology of the variable-delay element of the present invention.

In accordance with the various exemplary embodiments of the present invention, digitally adjustable resistors are used to construct the variable-delay element 200. FIG. 2 shows an exemplary embodiment of the general circuit topology of the variable-delay element of the present invention. As shown in FIG. 2, the variable delay element 200 may consist of an inverter 230 and a pull-down stack using a plurality of transistors 242 provided in a transistor array to construct a digitally adjustable resistor 240. As shown in FIG. 2, the pull-down stack uses a transistor array in which a plurality of columns and a plurality of rows are allowed. Each bit of the control signal b[n−1:0] is connected to the gate of one transistor (e.g., 242) in the transistor array 240.

It should be appreciated that all of the control bits for a particular row in FIG. 2 cannot be simultaneously zero to guarantee that the output can switch. In these embodiments, every control bit combination that blocks the pull-down stack is considered illegal. The resistance of the pull-down stack is minimal when all of the transistors of the array are conducting. The maximum resistance is achieved when, for each row, only the smallest transistor conducts.

Figure 3:
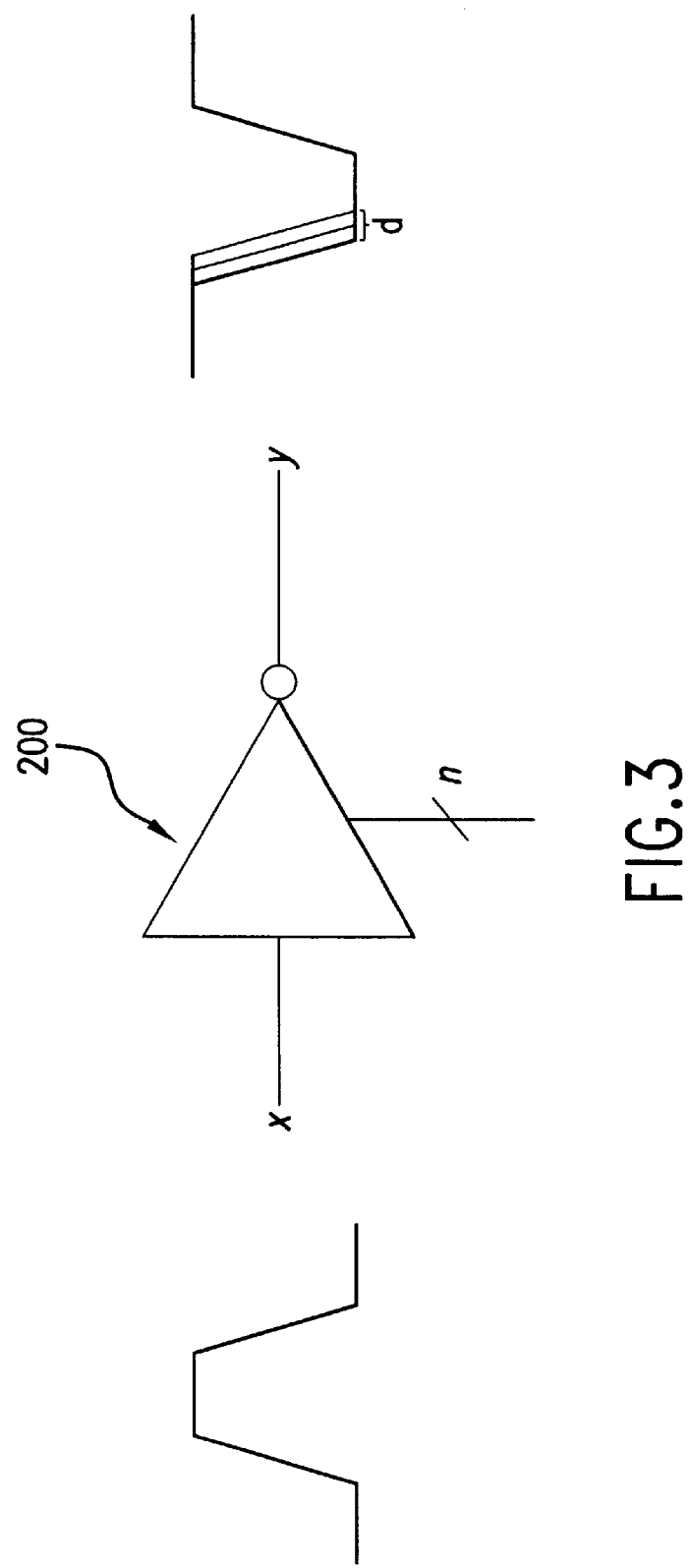
FIG. 3 shows a function of the exemplary variable-delay element of FIG. 2.

In accordance with the various exemplary embodiments of the present invention, a variable-delay element functions logically equivalent to an inverter in which the delay is varied in accordance with the variance in resistance of the digitally adjustable resistor. FIG. 3 shows a function of the exemplary variable-delay element of FIG. 2. As shown in FIG. 3, an input signal x is input to the variable-delay element 200, and output signal y is output from the variable-delay element 200. As shown in FIG. 3, an n-bit control signal sets the variable delay d between the rising input transition and the falling output transition. As the input signal x is input to the variable-delay element 200, the signal is inverted by the inverter 230 and with respect to the rising input transition, the falling output transition of the signal is delayed by a variable delay d by the digitally adjustable resistor 240. The inverted delayed output signal y is then output from the variable-delay element 200.

In accordance with these various embodiments, of the present invention, the digitally adjustable resistor 240 forming the variable-delay element 200 in the exemplary embodiment of FIG. 2 may be controlled with a considerably high resolution and over a wide range. In particular, by varying the sizes of the transistors 242 in the digitally adjustable resistor 240, or varying the control bit combinations for the digitally adjustable resistor 240, the variable delay d of the variable-delay element 200 constructed by the digitally adjustable resistor 240 is controlled. That is, the transistor sizes and the control bit combinations may be varied to vary the resistance of the digitally adjustable resistor 240. Thus, by increasing the resistance of the digitally adjustable resistor 240, the variable delay d of the variable-delay element 200 may be increased. Similarly, by decreasing the resistance of the digitally adjustable resistor 240, the variable delay d of the variable-delay element 200 may be decreased.

Selecting the Transistor Size

In various exemplary embodiments, the width constraint of binary-weighted transistors of a digitally adjustable resistor is removed. For example, in the exemplary embodiment of FIG. 2, the widths of the transistors 242 forming the digitally adjustable resistor 240 are not restricted to be 2, 4, 8, 16, 32, etc. times bigger than the smallest transistor width. In particular, the widths of the transistors 242 are randomly selected to obtain a good distribution of resistance values for the transistors 242.

In accordance with these various exemplary embodiments, the widths of the transistors 242 in the exemplary embodiment of FIG. 2 are randomly selected which produce a set of resistance value for the digitally adjustable resistor 240. A resistance label L is assigned to each combination of control bits b[n−1:0] that can be legally applied to the transistor array 240, the resistance label L being an integer. Each set of control bits determines which of the transistors 242 are ON and which are OFF.

In these exemplary embodiments, a desired resistance transfer function R(L) for the digitally adjustable resistor 240 and the maximum acceptable resistance deviation, Rdelta_desired, for the function are selected. The desired resistance transfer function R(L) includes a maximum value, Rmax_desired, and a minimum value, Rmin_desired. For each legal control bit combination L, the resistance of the digitally adjustable resistor 240 is determined, and the achievable resistances are then sorted in increasing order of resistance value. The randomly selected transistor widths are kept if the desired resistance transfer function R(L) is realizable with the minimum achievable resistance value Rmin and the maximum achievable resistance value Rmax of the sorted achievable resistances, and the maximum difference between two consecutive resistance values of the achievable resistances Rdelta. The desired resistance transfer function R(L) is realizable if 1) the minimum achievable resistance Rmin is less than the minimum value of the function Rmin_desired; 2) the maximum achievable resistance Rmax is greater than the maximum value of the function Rmax_desired; and 3) the maximum difference between two consecutive resistance values Rdelta is less than the maximum acceptable resistance deviation Rdelta_desired.

Selecting Control Bit Combinations

In accordance with other various exemplary embodiments of the present invention, a compact variable-delay element is constructed that does not require an output multiplexer, where multiple transistor rows and multiple transistor columns are provided in the digitally adjustable resistor. In various exemplary embodiments, limitations on the number of transistor rows are removed by, instead, determining appropriate values for the digital signal controlling the digitally adjustable resistor. By, for example, selecting legal control bit combinations, the appropriate values for the digital signal are determined.

In one exemplary embodiment for selecting the control bit combinations for the variable-delay element of FIG. 2, for example, the resistance label L is assigned to each combination of control bits b[n−1:0] that can be legally applied to the transistor array 240. The control bits are selected which produce a desired resistance value. Each set of control bits determines which of the transistors 242 are ON and which are OFF. In other words, each set of control bits defines a particular combination of transistors in parallel and in series. The control bit combinations can be selected under nominal conditions and under conditions subjected to random variations in the transistor array 240.

A. Nominal Conditions

In accordance with various exemplary embodiments of the present invention, the range of resistances for all of the legal bit combinations are determined. A desired pull-down resistance R(L) between the minimum value Rmin of the range and the maximum value Rmax of the range is closely approximated to be an approximated pull-down resistance Rapprox(L). In these exemplary embodiments, the control bits associated with the resistance label L are selected such that the absolute value of the difference between the approximated pull-down resistance and the desired pull-down resistance |Rapprox(L)−R(L)| is minimized. That is, the control bit combinations are selected such that the approximation error is minimized, and the approximated pull-down resistance Rapprox(L) is the closest obtainable value to the desired pull-down resistance R(L).

Because the desired pull-down resistances R(L) are arbitrary, the desired pull-down resistances R(L) can follow the points of any linear or non-linear function of L. However, the function followed by R(L) must be bounded by the minimum value Rmin and the maximum value Rmax of the range of resistances of all legal control bit combinations.

B. Random Variation Conditions

When a digitally adjustable resistor is subjected to random variations, the resistance corresponding to a particular control bit combination varies randomly from its nominal value. However, some control bit combinations are more stable than others. That is, the resistance may vary with the variance in channel length. For example, if the channel length of every transistor is varied randomly, the resistance corresponding to the combination label L0 may deviate from its nominal value by 2%. The resistance corresponding to L1, another control bit combination, may change by 5%. In such case, the resistance associated with the combination label L0 is more stable than that associated with the combination label L1.

In accordance with various exemplary embodiments of the present invention, under random variation conditions, the control bits applied to the digitally adjustable resistor are selected based on the premise that some combinations are more stable than others. With L as the label of a particular set of control bits and the range of resistance values corresponding to the combination label L being defined by an approximated minimum value Rminapprox(L) and an approximated maximum value Rmaxapprox(L) of a control bit combination when the digitally adjustable resistor is random perturbed, in accordance with these embodiments, the control bit combination to approximate a desired pull-down resistance R(L) between Rmin and Rmax of the control bit combination minimizes:

Max(|Rminapprox(L)−R(L)|,|Rmaxapprox(L)−R(L)|)

Thus, in accordance with these embodiments, the control bit combination is selected by minimizing the maximum of two quantities: the distance between the approximated minimum value Rminapprox(L) and R(L), and the distance between the approximated maximum value Rmaxpprox(L) and R(L). That is, in these embodiments, the control bit combination selected is the combination that minimizes the worst-case resistance deviation from the desired value.

Figure 4:
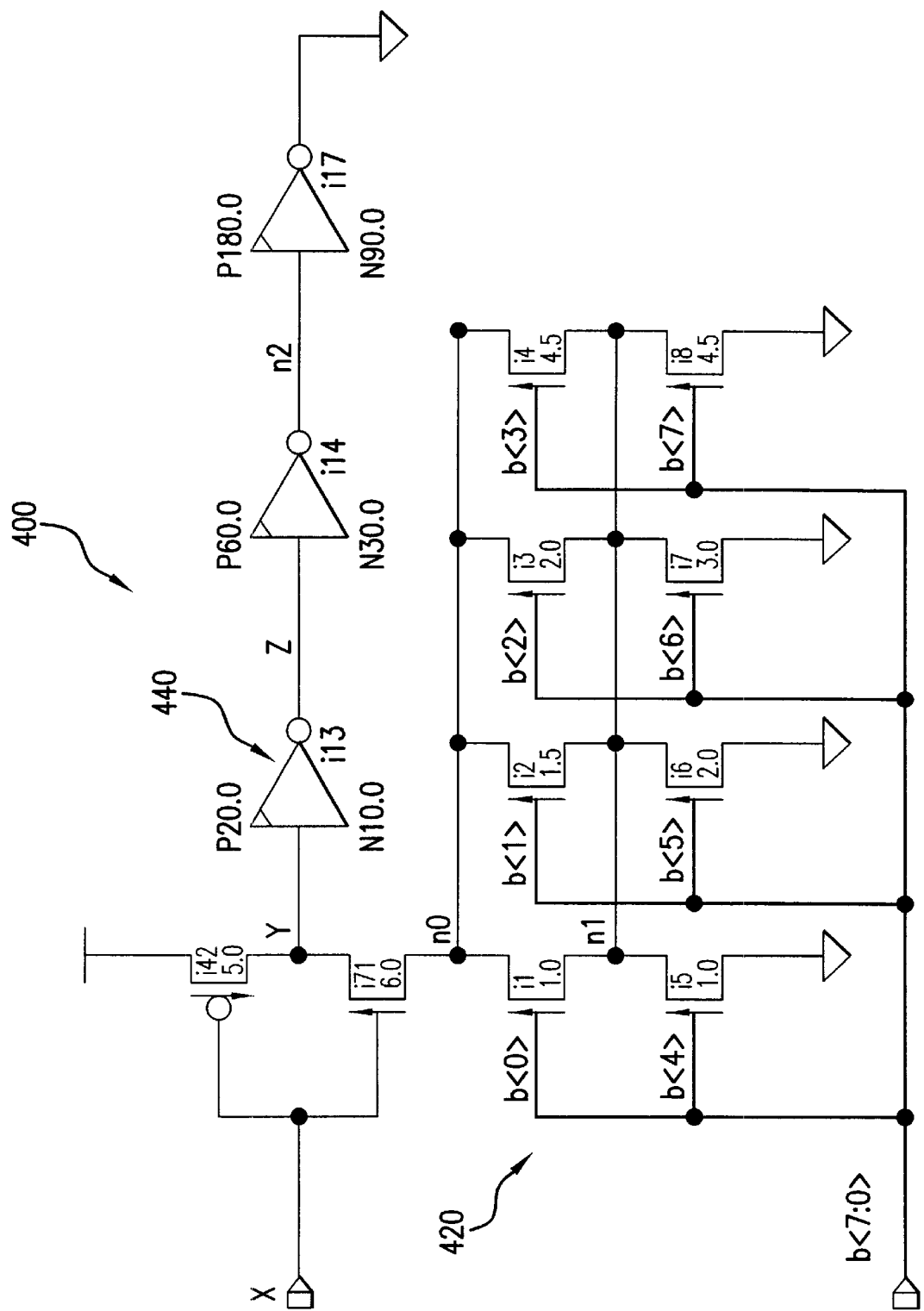
FIG. 4 shows one exemplary embodiment of the present invention in which a digitally adjustable resistor is followed by an inverter.

FIG. 4 shows one exemplary embodiment of the present invention in which a digitally adjustable resistor is followed by an inverter. As shown in FIG. 4, the variable-delay element 400 may include a digitally adjustable resistor 420, followed by an inverter 440. In FIG. 4, the input to the variable-delay element 400 is x. The output of the variable-delay element 400 is y, and the output of the inverter 440 is z.

The inverter 440 helps to protect the output of the variable-delay element 400. The variable-delay element 400 in FIG. 4 adjusts the rising edge of the output z of the inverter 440 in small linear steps, while the resistance of the digitally adjustable resistor 420 is not linear. That is, there is a non-linear relationship between the resistance of the digitally adjustable resistor 420 and the delay of the variable-delay element 400. Accordingly, in order to obtain linear delay steps, non-linear resistance values are selected. In fact, by purposely choosing non-linear steps for the digitally adjustable resistor 420, second-order delay variations due to the inverter 440 may be compensated. In particular, the digitally adjustable resistor 420 of FIG. 4 may be used to compensate the variable shape and transition time of the output y from the variable-delay element 400.

Since the falling edge of the output y from the digitally adjustable resistor 420 is adjustable, the rising edge of the output z from the inverter 440 is also adjustable. In one exemplary embodiment, 256 possible control bit combinations are provided, with 225 legal combinations and 31 illegal combinations. In this exemplary embodiment, by choosing 51 of the legal combinations, the rising edge of the output z from the inverter 440 can be varied in 1-ps steps over a 50-ps range.

Figure 5:
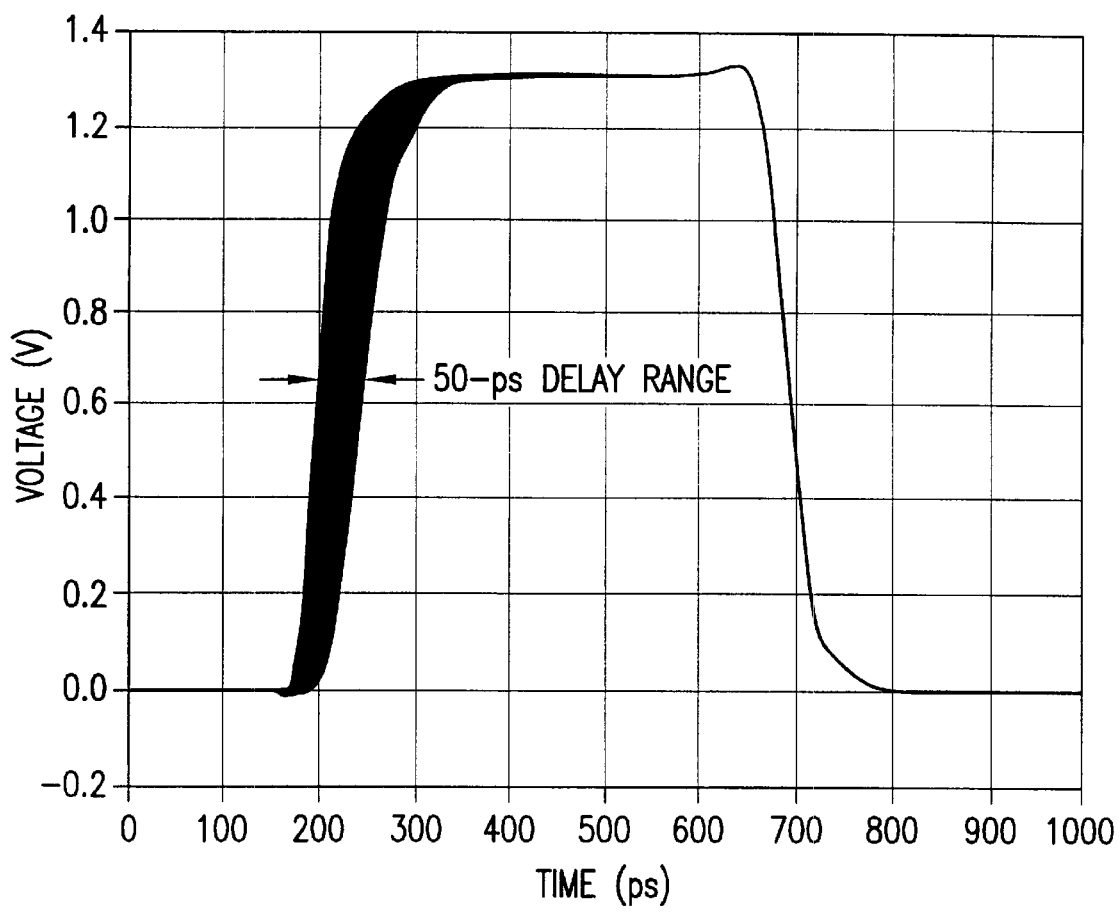
FIG. 5 shows one exemplary simulated waveform associated with each control bit combination.

FIG. 5 shows exemplary simulated waveforms associated with each control bit combination. As shown in FIG. 5, the transition time, i.e., the time required to go from 20% to 80% of the maximum voltage, of the rising edge is nearly constant. That is, as shown in FIG. 5, to go from 0.26V (20% of the maximum voltage 1.3V) to 1.04V (80% of the maximum voltage 1.3V), the delay range is around 50 ps, which is nearly constant. The falling edge is practically not disturbed by the variable resistance of the pull-down stack. When the rising edge moves, the position of the falling edge remains within 0.5 ps of its average value.

As shown in the above exemplary embodiments, the digitally adjustable resistor can be used to construct a variable-delay element, which in turn may be used in high-frequency microprocessor debugging, for example. In such instances, the variable-delay element may remain linear under various process, voltage and temperature conditions. For example, the variable-delay element's 1-ps resolution is sufficient for path-delay characterization. Since the variable-delay element is topologically similar to a static logic gate, its area and power dissipation may be relatively small. Moreover, the clock adjustment mechanism used for debugging in the clock distribution network may become reasonably robust against random channel length variations.

Because of its high resolution, the digitally adjustable resistor can be used to compensate a wide variety of non-linear effects, by appropriately selecting desired control bit combinations.

Figure 6:
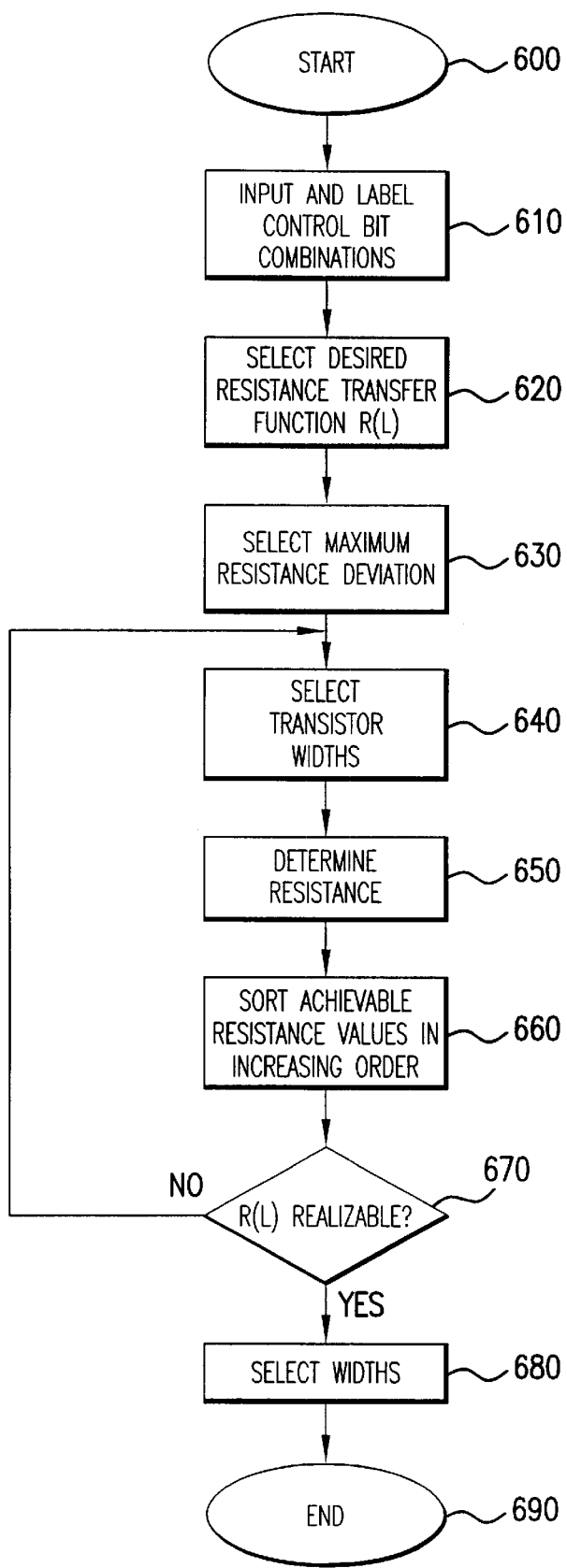
FIG. 6 is a flow chart of an exemplary method for selecting the transistor sizes.

FIG. 6 is a flow chart of a method of selecting transistor widths of the present invention. Beginning at step 600, control proceeds to step 610, where each combination of control bits b[n−1:0] that can be legally applied to the transistor array is input. A resistance label L is assigned to each legal combination. Next, in step 620, the desired resistance transfer function R(L) is selected. Control then continues to step 630.

In step 630, the maximum resistance deviation that is acceptable for the desired resistance transfer function Rdelta_desired is selected. In addition, the minimum value of the desired resistance transfer function Rmin_desired and the maximum value of the resistance transfer function Rmax_desired is also selected. Then, in step 640, transistor widths for the input control bit combination is selected. The transistor widths are selected randomly. Control then continues to step 650

In step 650, the resistance for each legal input control bit combination is determined. Next, in step 660, the achievable resistance values are sorted in increasing order. Then, in step 670, it is determined as to whether or not the desired resistance transfer R(L) realizable based on the sorted achievable resistance values. The desired resistance transfer function R(L) is realizable if 1) the minimum achievable resistance Rmin of the sorted achievable resistance values is less than the minimum value of the function Rmin_desired; 2) the maximum achievable resistance Rmax of the sorted achievable resistance values is greater than the maximum value of the function Rmax_desired; and 3) the maximum difference Rdelta between two consecutive resistance values of the sorted achievable resistance values is less than the maximum acceptable resistance deviation Rdelta_desired. If desired resistance transfer function R(L) is not realizable, that is, if one of the three determining conditions in step 670 are not met, control returns to step 640. Otherwise, the desired resistance transfer function R(L) is realizable and control continues to step 680.

In step 680, the transistor widths are selected for the transistor array. Control then continues to step 690, where the process ends.

Figure 7:
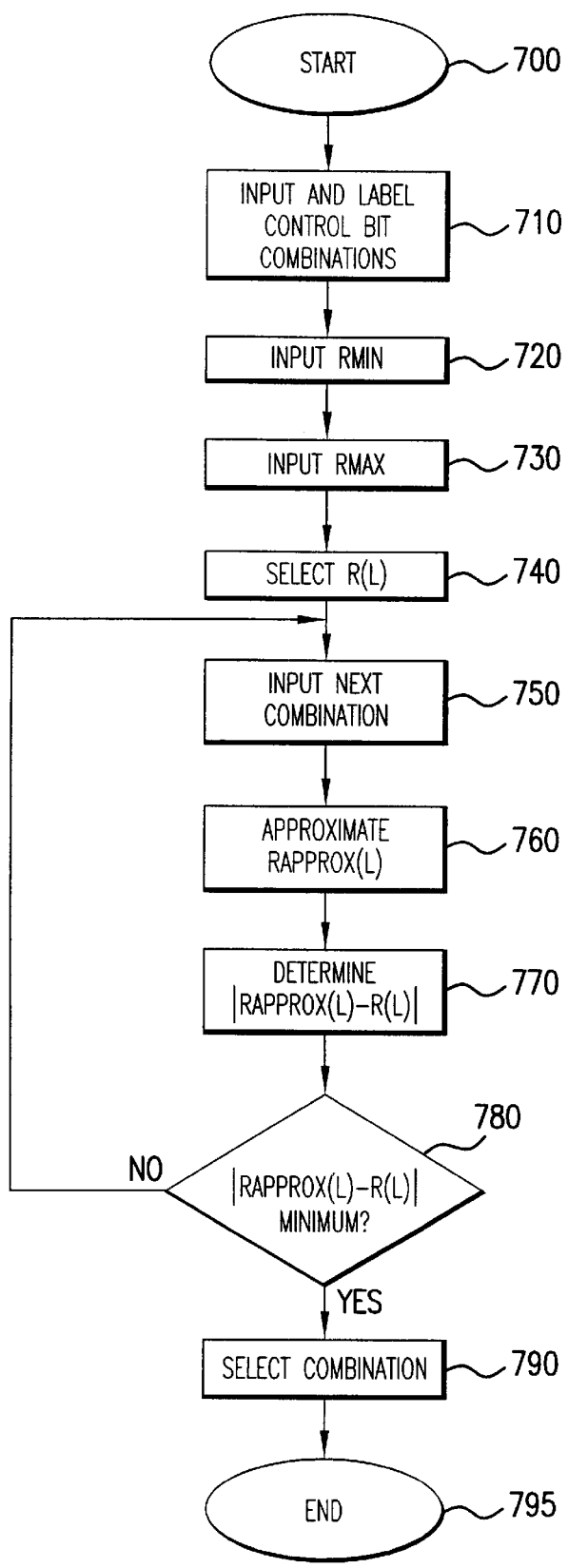
FIG. 7 is a flow chart of an exemplary method for selecting control bit combinations under nominal conditions.

FIG. 7 is a flow chart of a method of selecting control bit combinations under nominal fabrication conditions of the present invention. Beginning at step 700, control proceeds to step 710, where each combination of control bits b[n−1:0] that can be legally applied to the transistor array is input. A resistance label L is assigned to each legal combination. Next, in step 720, the minimum value Rmin for the range of resistance values for a plurality of legal control bit combinations is input. Control then continues to step 730.

In step 730, the maximum value Rmax for the range of resistance values for the legal control bit combinations is input. Next, in step 740, a desired pull-down resistance R(L) is selected. The desired pull-down resistance R(L) can be any value lying between the minimum value Rmin and the maximum value Rmax. Control then continues to step 750.

In step 750, the next legal control bit combination is input. Next, in step 760, the desired pull-down resistance is approximated as Rapprox(L) using the input combination. Then, in step 770, |Rapprox(L)−R(L)| is determined. Control then continues to step 780.

In step 780, it is determined as to whether or not |Rapprox(L)−R(L)| for the input legal control bit combination is the minimum. That is, it is determined as to whether |Rapprox(L)−R(L)| for the current input legal control bit combination is the minimum of all legal control bit combinations. If |Rapprox(L)−R(L)| for the input legal control bit combination is not the minimum, the desired pull-down resistance is not closely approximated by the input legal control bit, and thus control returns to step 750 for the input of the next combination. Otherwise, if Rapprox(L)−R(L)| is the minimum, the desired pull-down resistance is closely approximated, and control continues to step 790.

In step 790, the control bit combination is selected for the transistor array. Control then continues to step 795, where the process ends.

Figure 8:
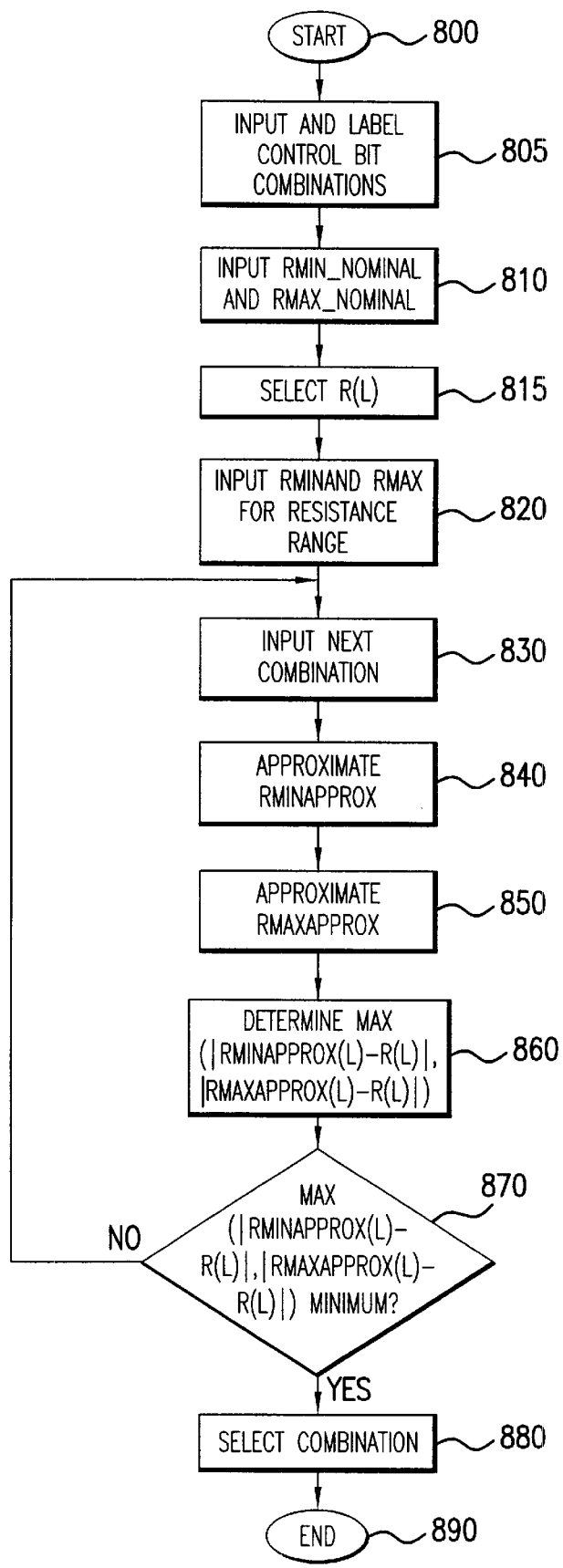
FIG. 8 is a flow chart of an exemplary method for selecting control bit combinations under random variation conditions.

FIG. 8 is a flow chart of an exemplary method for selecting control bit combinations with toleration for random fabrication variation in the transistor array. Beginning at step 800, control proceeds to step 805, where each combination of control bits b[n−1:0] that can be legally applied to the transistor array is input. A resistance label L is assigned to each legal combination. Next, in step 810, the minimum value Rmin_nominal and the maximum value Rmax_nominal for all legal control bit combination are input. Control then continues to step 815.

In step 815, the desired pull-down resistance R(L) is selected. The desired pull-down resistance R(L) can be any value lying between the minimum value Rmin_nominal and the maximum value Rmax_nominal of the transistor array for the input control bit combination. Next, in step 820, the minimum value Rmin and the maximum value Rmax for the range of resistance values for all of the legal control bit combinations are input. Then, in step 830, the next legal control bit combination is input. Control then continues to step 840.

In step 840, the approximate minimum value Rminapprox for the transistor array for a plurality of fabrication variations is determined based on the input control bit combination. Next, in step 850, the approximated maximum value Rmaxapprox for the transistor array under the same fabrication variations is determined. ontrol then continues to step 860.

In step 860, the maximum of 1) the distance between the approximated minimum value and the desired pull-down resistance, and 2) the distance between the approximated maximum value and the desired pull-down resistance Max (|Rminapprox(L)−R(L)|,|Rmaxapprox(L)−R(L)|) is determined. That is, in step 860, the worst-case resistance deviation from the desired value is determined. Next, in step 870, it is determined as to whether or not Max(|Rminapprox(L)−R(L)|,| Rmaxapprox(L)−R(L)|) for the input legal control bit combination is the minimum. If Max(|Rminapprox(L)−R(L) |,|Rmaxapprox(L)−R(L)|) is not the minimum, the desired pull-down resistance is not closely approximated by the input legal control bit combination, and thus control returns to step 820 for the input of the next combination. Otherwise, if Max(|Rminapprox(L)−R(L)|,|Rmaxapprox(L)−R(L)|) is the minimum, the desired pull-down resistance is closely approximated, and control continues to step 880.

In step 880, the control bit combination is selected for the transistor array. Control then continues to step 890, where the process ends.

In the embodiments discussed above, different control bits produce different pull-down resistances. A relatively small number of bits can produce a large number of resistance values.

Although the digitally adjustable resistor described in FIGS. 2–8 is shown implementing a transistor array of a pull-down stack, its principles of operation would not change for a transistor array of a pull-up stack. That is, it should be appreciated that the present invention is not limited to an array of a pull-down stack. In accordance with various exemplary embodiments of the present invention, a transistor array may comprise an nFET array of a pull-down stack and a pFET array of a pull-up stack.

Figure 9:
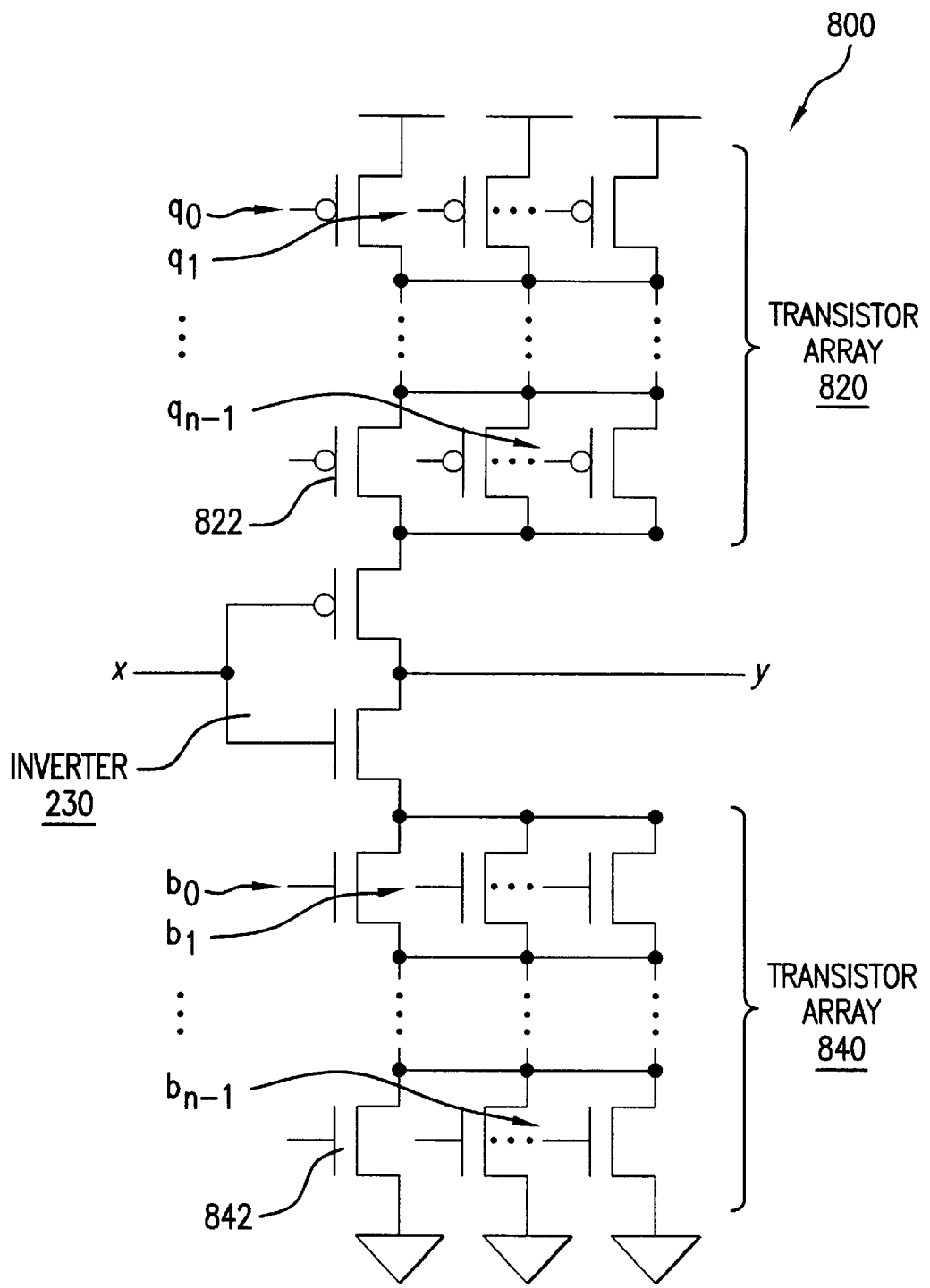
FIG. 9 shows another exemplary embodiment of the general circuit topology of the variable-delay element of the present invention.

FIG. 9 shows another exemplary embodiment of the general circuit topology of the variable-delay element of the present invention, where the variable delay element is further implemented with a transistor array part of a pull-up stack. As shown in FIG. 9, the variable-delay element 800 may consist of a pull-up stack using a plurality of transistors 822 provided in a first transistor array 820, and a pull-down stack using a plurality of transistors 842 provided in a second transistor array 840.

As shown in FIG. 9, the pull-up stack and pull-down stack each use a transistor array in which a plurality of rows are allowed. In FIG. 9, the first and second transistor arrays 820 and 840 each forms a digitally adjustable resistor. Each bit of the control signal q[n−1:0] is connected to the gate of one of the transistors 822 of the first transistor array 820, while each bit of the control signal p[n−1:0] is connected to the gate of one transistor 842 of the second transistor array 840.

Figure 10:
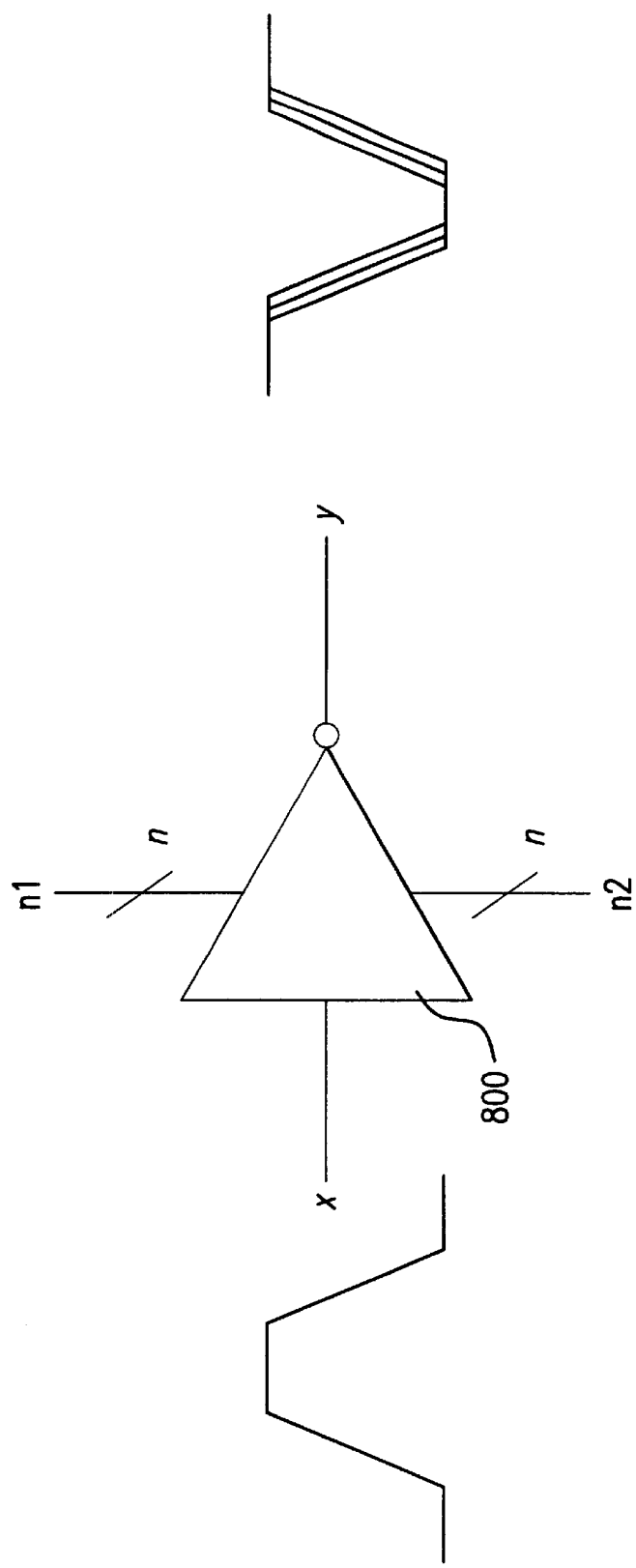
FIG. 10 shows a function of the exemplary variable-delay element of FIG. 9.

FIG. 10 shows a function of the exemplary variable-delay element of FIG. 9. As shown in FIG. 10, an input signal x is input to the variable delay element 800. An output signal y is output from the variable-delay element 800. In this exemplary embodiment, as shown in FIG. 10, both the rising edge and the falling edge of the input signal can be manipulated. That is, as shown in FIG. 10, the n-bit control signals n1 and n2 set the variable delay d1 and the variable delay d2 from the rising transition of x to the rising transition of y and from the falling transition of x to the falling transition of y, respectively.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. A method of selecting a control bit combination, comprising:

determining a minimum value and a maximum value for a range of resistance values for a plurality of legal control bit combinations;

approximating a minimum resistance value and a maximum resistance value of a control bit combination from the plurality of legal control bit combinations for a plurality of fabrication variations;

selecting a desired resistance value within the range between the approximated minimum resistance value and the approximated maximum resistance value;

selecting the control bit combination based on the approximated minimum resistance value, the approximated maximum resistance value and the desired resistance value; and determining a worst-case resistance deviation from the desired resistance value.

2. The method of claim 1, determining the worst-case resistance deviation comprising determining a maximum difference between a distance between the approximated minimum resistance value and the desired resistance value, and a distance between the approximated maximum resistance value and the desired resistance value.

3. The method of claim 2, the control bit combination being selected when the maximum difference between a distance between the approximated minimum resistance value and the desired resistance value, and a distance between the approximated maximum resistance value and the desired resistance value, is minimum.

4. The method of claim 1, wherein the plurality of legal control bit combinations provide resistance values that are evenly distributed between the minimum value and the maximum value for the range of resistance values.

5. The method of claim 1, wherein the fabrication variations are random.

6. An apparatus comprising:

a variable delay element; and a processing element, coupled to the variable delay element, to determine a minimum value and a maximum value for a range of resistance values for a plurality of legal control bit combinations provided to the variable delay element, approximate a minimum resistance value and a maximum resistance value of a control bit combination from the plurality of legal control bit combinations for a plurality of fabrication variations in the variable delay element, select a desired resistance value within the range between the approximated minimum resistance value and the approximated maximum resistance value, select the control bit combination based on the approximated minimum resistance value, the approximated maximum resistance value and the desired resistance value, and determine a worst-case resistance deviation from the desired resistance value.

7. The apparatus of claim 6, wherein the variable delay element includes an inverter and a digitally adjustable resistor.

8. The apparatus of claim 7, wherein the inverter is to invert an input signal.

9. The apparatus of claim 7, wherein the digitally adjustable resistor comprises a plurality of transistors in a plurality of columns and a plurality of rows.

10. The apparatus of claim 6, further comprising a controller to provide the plurality of legal control bit combinations to the variable delay element, the control bit combinations being selected such that resistance values are evenly distributed between the minimum and the maximum resistance values.

* * * * *